United States Patent
Takashima

(10) Patent No.: US 8,847,952 B2
(45) Date of Patent: Sep. 30, 2014

(54) GEOMETRY SIMPLIFICATION APPARATUS, GEOMETRY SIMPLIFICATION METHOD, AND PROGRAM

(75) Inventor: Hironori Takashima, Kawasaki (JP)

(73) Assignee: Canon Kabushiki Kaisha, Tokyo (JP)

( * ) Notice: Subject to any disclaimer, the term of this patent is extended or adjusted under 35 U.S.C. 154(b) by 692 days.

(21) Appl. No.: 12/954,233

(22) Filed: Nov. 24, 2010

(65) Prior Publication Data

US 2011/0128284 A1 Jun. 2, 2011

(30) Foreign Application Priority Data

Nov. 30, 2009 (JP) ................................ 2009-272426

(51) Int. Cl.
 *G06T 17/00* (2006.01)
 *G06F 19/00* (2011.01)
 *G06F 17/50* (2006.01)
 *G06T 17/20* (2006.01)
 *G06T 19/20* (2011.01)

(52) U.S. Cl.
 CPC ......... *G06T 17/20* (2013.01); *G06T 2219/2021* (2013.01); *G06F 17/5018* (2013.01); *G06T 19/20* (2013.01); *Y10S 715/964* (2013.01)
 USPC .................. 345/420; 700/98; 703/1; 715/964

(58) Field of Classification Search
 CPC ..... G06F 17/24; G06F 17/50; G06F 2217/06; G06F 3/0237; G06F 17/501; G06T 2200/24; G06T 19/00; G06T 5/002; G06T 5/005; G06T 17/00; G06T 17/20; G06T 17/10; H04N 1/00517; G06K 9/6211
 USPC .................. 345/420; 700/98; 703/1; 715/964
 See application file for complete search history.

(56) References Cited

U.S. PATENT DOCUMENTS

| 7,646,384 B2 * | 1/2010 | Anderson et al. ............. 345/420 |
| 8,332,061 B2 * | 12/2012 | Baloch et al. .................. 700/98 |
| 2008/0036765 A1 | 2/2008 | Hariya |

FOREIGN PATENT DOCUMENTS

| JP | 2000-331194 A | 11/2000 |
| JP | 2008-040921 A | 2/2008 |
| JP | 2008-217708 A | 9/2008 |
| JP | 2009-258889 A | 11/2009 |

OTHER PUBLICATIONS

Find and replace text or other items for Microsoft Office Word 2007, 2007, retrieved from http://office.microsoft.com on Dec. 20, 2013.*
Bajaj et al., Geometric Search and Replace in Solid Model Editing, Comptuer Science Technical Reports, Department of Computer Science, Purdue University, Report No. 92-078, 1992.*

* cited by examiner

*Primary Examiner* — Kee M Tung
*Assistant Examiner* — Haixia Du
(74) *Attorney, Agent, or Firm* — Canon U.S.A., Inc. IP Division

(57) ABSTRACT

The present invention relates to a geometry simplification apparatus including a simplification target feature extractor and a geometry simplification processor. The simplification target feature extractor extracts a second feature, similar to a first feature in geometry from a part for which geometry simplification is manually performed, based on information about the first feature. The geometry simplification processor simplifies the second feature extracted by the simplification target feature extractor based on information about a geometry simplification method performed to the first feature.

19 Claims, 18 Drawing Sheets

FIG. 4A
BEFORE GEOMETRY SIMPLIFICATION
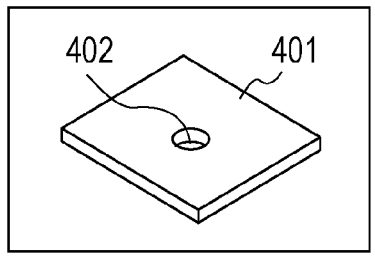
AFTER GEOMETRY SIMPLIFICATION
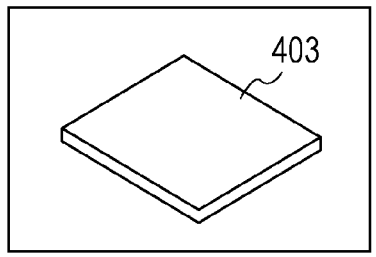
FIG. 4B
BEFORE GEOMETRY SIMPLIFICATION
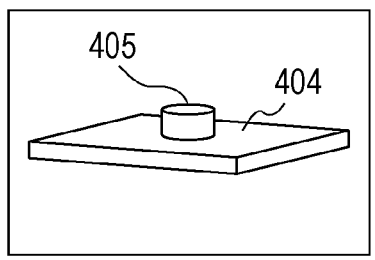
AFTER GEOMETRY SIMPLIFICATION
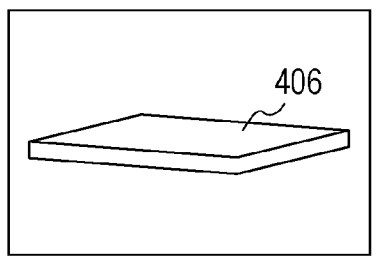
FIG. 4C
BEFORE GEOMETRY SIMPLIFICATION
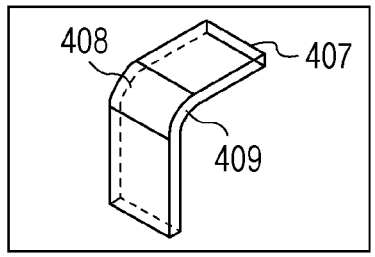
AFTER GEOMETRY SIMPLIFICATION
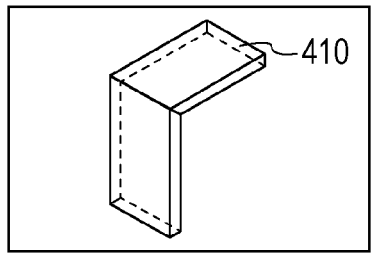
FIG. 4D
BEFORE GEOMETRY SIMPLIFICATION
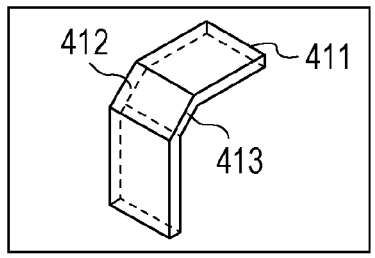
AFTER GEOMETRY SIMPLIFICATION
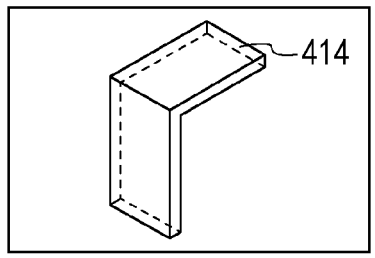

FIG. 6

| SELECTION ORDER | FACE 11 → FACE12 → FACE 13 |
|---|---|
| SIMPLIFICATION METHOD | DELETION OF FACE |

FIG. 7

| SELECTED FEATURE | TYPE | AREA [mm²] | ADJACENCY RELATIONSHIP | NUMBER OF EDGES | ANGLE FORMED BY NORMAL VECTORS OF ADJACENT FACES AT POINT ON COMMON EDGE BETWEEN ADJACENT FACES | AMOUNT OF VARIATION IN VOLUME [mm³] |
|---|---|---|---|---|---|---|
| FACE 11 | CYLINDRICAL FACE (180°) | 0.57 | 12: ADJACENT<br>13: ADJACENT | CURVED LINE: 2<br>STRAIGHT LINE: 2 | 12: 0 DEGREES<br>13: 0 DEGREES | +0.32 |
| FACE 12 | PLAIN FACE | 0.3 | 11: ADJACENT<br>13: VIA 11 | CURVED LINE: 0<br>STRAIGHT LINE: 4 | 11: 0 DEGREES | |
| FACE 13 | PLAIN FACE | 0.3 | 11: ADJACENT<br>12: VIA 11 | CURVED LINE: 0<br>STRAIGHT LINE: 4 | 11: 0 DEGREES | |

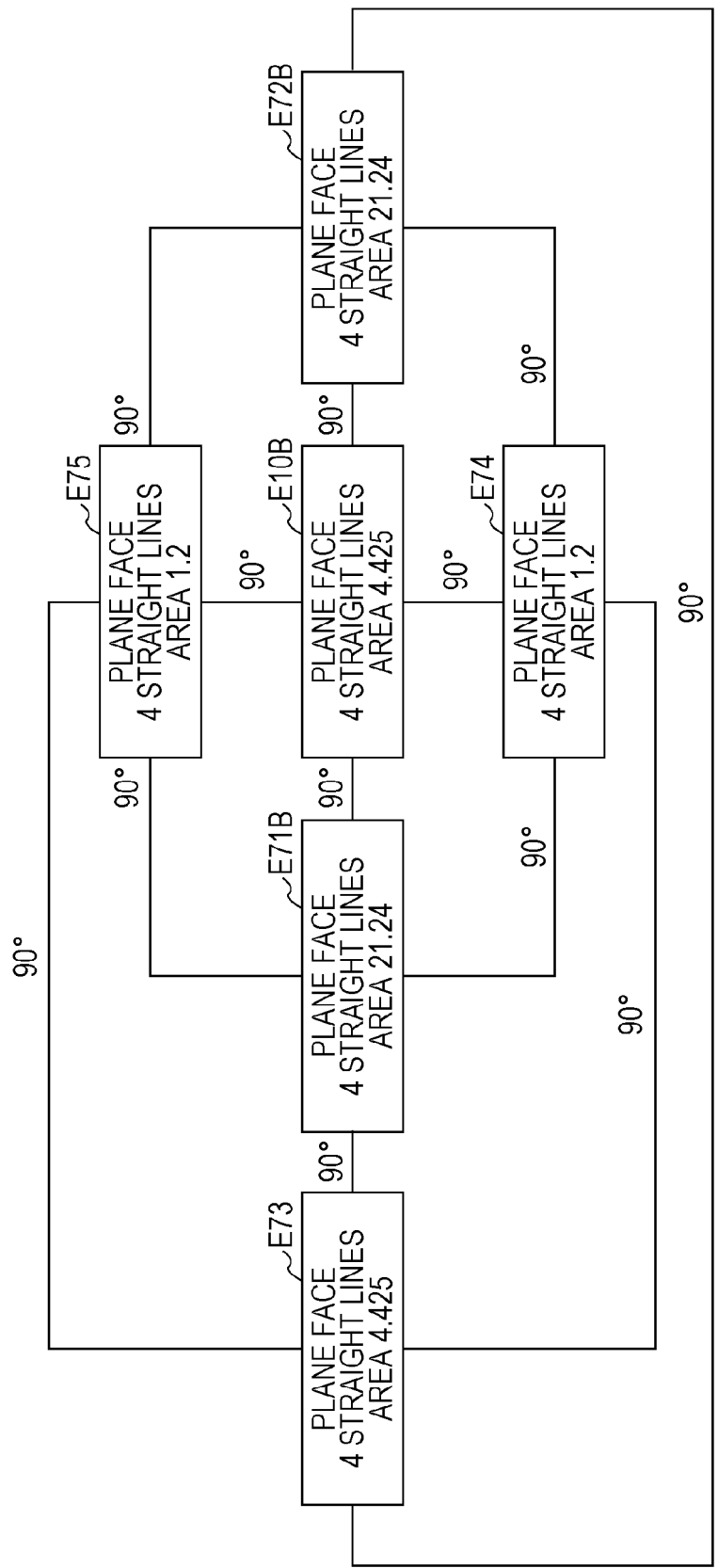

FIG. 15
| RECORDED SIMPLIFICATION | SIMPLIFICATION TARGET FEATURES |
|---|---|
| 1 | 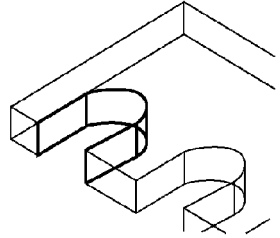 |
| 2 | 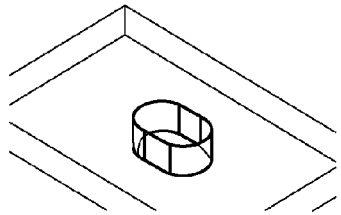 |

GEOMETRY SIMPLIFICATION APPARATUS, GEOMETRY SIMPLIFICATION METHOD, AND PROGRAM

BACKGROUND OF THE INVENTION

1. Field of the Invention

The present invention relates to a technology to improve the working efficiency, for example, in creation of a numerical analysis model from a computer aided design (CAD) model to be analyzed.

2. Description of the Related Art

CAD is widely used in design of parts and products. Methods of practically using three-dimensional CAD models (hereinafter abbreviatedly referred to as CAD models) include analysis using a finite element method. Since it takes longer calculation time to practically use the CAD models in the analysis if complicated geometries and/or minute geometries exist, geometry simplification (hereinafter abbreviatedly referred to as simplification) is generally performed to alter the complicated and/or minute geometries into simple geometries keeping a certain calculation accuracy level.

The following technologies in related art are known as methods of efficiently simplifying multiple similar geometries that exist in a CAD model and that are unnecessary for simulation. Japanese Patent Laid-Open No. 2008-040921 discloses a technology in which meshes are created on the surface of a CAD model, the surface meshes are grouped into partial surface meshes, similar partial surface meshes are extracted from the partial surface meshes resulting from the grouping, and the extracted similar partial surfaced meshes are replaced with simplified surface meshes. In the technology disclosed in the Japanese Patent Laid-Open No. 2008-040921, specifically, the angle formed by the normal vectors of adjacent meshes is used as a threshold value to create the partial surface meshes. Then, the distance between the centroids of the surface meshes composing the partial surface meshes and the angle formed by the normal vectors of the surface meshes are accumulated with the areas of the surface meshes to create a histogram. Similar partial surface meshes are extracted from feature values calculated on the basis of the histogram and the extracted partial surface meshes are replaced with the same simplified mesh. Japanese Patent Laid-Open No. 2000-331194 discloses a technology in which a simplification method that is recorded is read out to perform the same simplification process again. In the technology disclosed in the Japanese Patent Laid-Open No. 2000-331194, when the geometry of a CAD model is changed, a simplification process recorded before the geometry of the CAD model is changed is read out from a database and the readout simplification process is applied to the CAD model subjected to the geometry change.

However, since the surface meshes cannot often be created for a CAD model having a complicated geometry and/or a minute geometry with the technology disclosed in Japanese Patent Laid-Open No. 2008-040921, it is not possible to apply the technology. In addition, the size or geometry of the surface meshes may be varied depending on, for example, the geometry of the CAD model and/or the positional relationship thereof. Accordingly, setting the angle formed by the normal vectors of adjacent meshes, which is used as the threshold value for the formation of the partial surface meshes, to a lower value causes many minute partial surface meshes to be formed to complicate the subsequent processing. In contrast, setting the above angle to a higher value causes coarse partial surface meshes to be formed. In this case, features that should be grouped into different partial surface meshes are recognized as the same partial surface mesh to complicate the subsequent processing.

The simplification process that is performed before the geometry of part of the CAD model is changed is read out and the readout simplification process is applied to the CAD model subjected to the geometry change in the technology disclosed in Japanese Patent Laid-Open No. 2000-331194. Accordingly, it is necessary to separately perform the simplification for other parts and other features in the same part. In the present situation, in order to simplify multiple similar geometries that exist in a CAD model and that are unnecessary for simulation, a user manually performs the simplification or the geometry change while visually confirming the similar geometries. Accordingly, there is a problem in that it takes a lot of effort and time to create a simplification model.

SUMMARY OF THE INVENTION

The present invention provides a geometry simplification apparatus, a geometry simplification method, and a program capable of efficiently creating an analysis model.

According to an aspect of the present invention, a geometry simplification apparatus includes an extraction unit configured to extract a second feature, similar to a first feature in geometry from a part for which geometry simplification is manually performed, based on information about the first feature and a simplification unit configured to simplify the second feature extracted by the extraction unit based on information about a geometry simplification method performed to the first feature.

Further features of the present invention will become apparent from the following description of exemplary embodiments with reference to the attached drawings.

BRIEF DESCRIPTION OF THE DRAWINGS

FIGS. 4A to 4D illustrate CAD models before and after simplification of feature geometries.

FIG. 6 shows an example of the content of recording in a simplification process recorder in terms of the simplification process described above with reference to FIGS. 5A to 5D.

FIG. 7 shows an example of the content of recording in a simplification feature recorder in terms of the simplification process described above with reference to FIGS. 5A to 5D.

FIG. 14B is a connection graph of the simplification model in FIG. 14A.

FIG. 15 is an exemplary list of simplification processes that are recorded.

DESCRIPTION OF THE EMBODIMENTS

Various embodiments of the present invention will now be described in detail with reference to the drawings. It should be noted that the relative arrangement of the components, the numerical expressions and numerical values set forth in these embodiments do not limit the scope of the present invention unless it is specifically stated otherwise.

Figure 1:
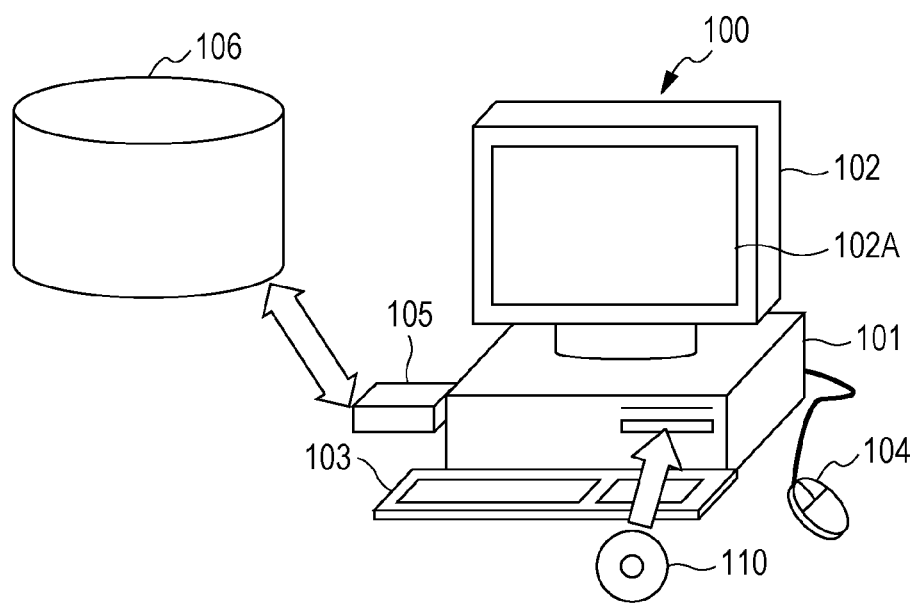
FIG. 1 is a perspective view of a computer system according to an embodiment of the present invention.

A computer system according to an embodiment of the present invention will now be described. FIG. 1 is a perspective view of the computer system according to the present embodiment. Referring to FIG. 1, a computer system 100 includes a main body 101, a display 102, a keyboard 103, and a mouse 104. The main body 101 includes a central processing unit (CPU), a disk drive, and so on. The display 102 displays an image of, for example, a CAD model on a display screen 102A in response to an instruction from the main body 101. The keyboard 103 is used by a user to input a variety of information into the computer system 100. The mouse 104 is used by the user to specify an arbitrary position on the display screen 102A of the display 102. A modem 105 is used to access an external database or the like to download, for example, a program stored in another computer system.

A program (CAD software) giving at least a CAD function to the computer system 100 is stored in a portable recording medium, such as a disk 110, or is downloaded from a recording medium 106 in another computer system via a communication unit, such as the modem 105. The downloaded program is received by the computer system 100 where the program is compiled. The program causes the computer system 100 (specifically, a CPU 201 described below) to operate as a CAD system having the CAD function. For example, the disk 110, an integrated circuit (IC) card memory, a magnetic disk such as a floppy disk (registered trademark), a magneto-optical disk, or a compact disc-read only memory (CD-ROM) is used as a computer-readable recording medium having the program recorded thereon. However, the computer-readable recording medium is not limited to such a portable recording medium. For example, a non-transitory recording medium that can be accessed from the computer system connected via a communication unit, such as the modem 105 or a local area network (LAN), can also be used as the computer-readable recording medium.

Figure 2:
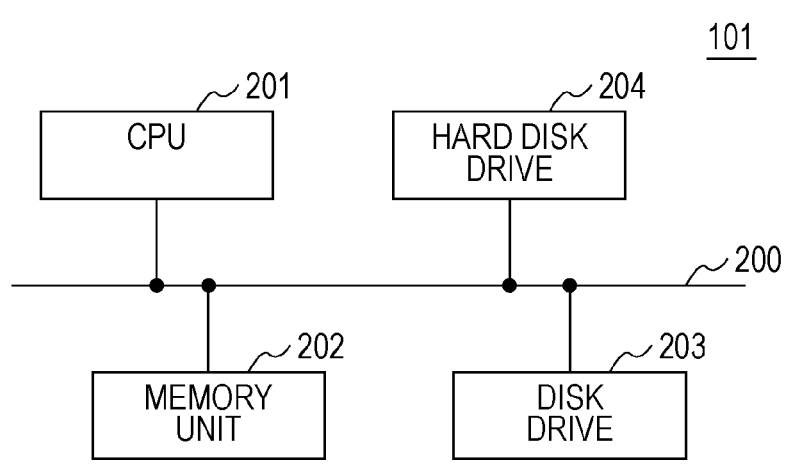
FIG. 2 is a block diagram showing an example of the configuration of the main parts in a main body of the computer system according to the present embodiment of the present invention.

FIG. 2 is a block diagram showing an example of the configuration of the main parts in the main body 101 of the computer system 100. Referring to FIG. 2, the main body 101 includes the CPU 201, a memory unit 202 including a random access memory (RAM), a read only memory (ROM), and so on, a disk drive 203 for the disk 110, and a hard disk drive 204. The CPU 201, the memory unit 202, the disk drive 203, and the hard disk drive 204 are connected to each other via a bus 200. Although the display 102, the keyboard 103, and the mouse 104 are also connected to the CPU 201 via the bus 200, the display 102, the keyboard 103, and the mouse 104 may be directly connected to the CPU 201. The display 102 may be connected to the CPU 201 via a known graphic interface (not shown) that processes image data that is input or output.

In the computer system 100, the keyboard 103 and the mouse 104 compose an input unit in the CAD system. The display 102 composes an output unit displaying, for example, a CAD model on the display screen 102A. The configuration of the computer system 100 is not limited to the one shown in FIG. 2 and another known configuration may be adopted. The computer system 100 is an example to which a geometry simplification apparatus is applied.

Figure 3:
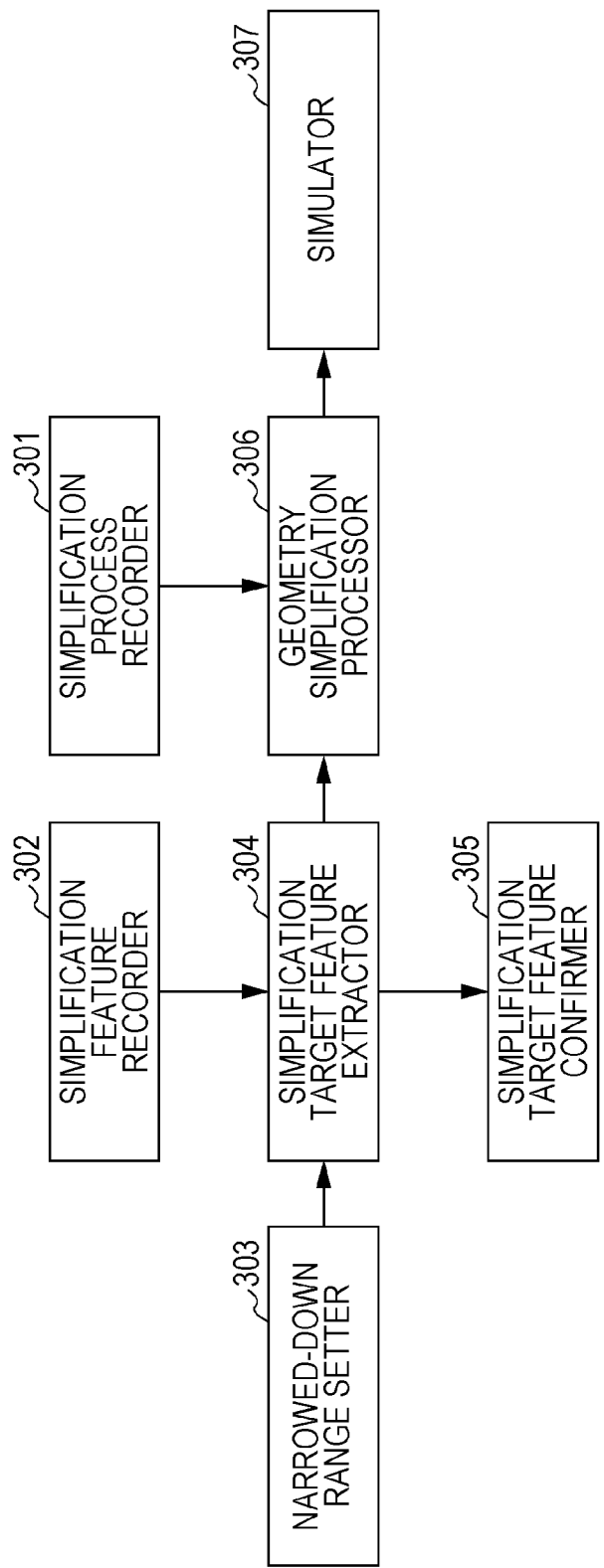
FIG. 3 is a block diagram showing an example of the functional configuration of the computer system according to the present embodiment of the present invention.

FIG. 3 is a block diagram showing an example of the functional configuration of the computer system 100 according to the present embodiment. Referring to FIG. 3, the computer system 100 includes a simplification process recorder 301, a simplification feature recorder 302, a narrowed-down range setter 303, a simplification target feature extractor 304, a simplification target feature confirmer 305, a geometry simplification processor 306, and a simulator 307. The functions of the simplification process recorder 301 and the simplification feature recorder 302 are realized by, for example, the memory unit 202. The functions of the narrowed-down range setter 303 to the simulator 307 are realized by the CPU 201 that executes the program (CAD software). The simplification process recorder 301 records a process of selecting a simplification feature (first feature) in a simplification process that has been manually performed and a method of simplifying the simplification feature. The simplification feature recorder 302 records geometrical information and topological information about the feature subjected to the manual simplification process. The narrowed-down range setter 303 receives information about a range to which the feature to be simplified is narrowed down. The simplification target feature extractor 304 extracts a simplification target feature (second feature) on the basis of the geometrical information and the topological information recorded in the simplification feature recorder 302 and the range which is set by the narrowed-down range setter 303 and to which the feature to be simplified is narrowed down. The simplification target feature confirmer 305 allows the user to confirm the simplification target feature extracted by the simplification target feature extractor 304. The geometry simplification processor 306 performs the simplification process recorded in the simplification process recorder 301 to the simplification target feature extracted by the simplification target feature extractor 304. The simulator 307 simulates a numerical analysis model (hereinafter abbreviatedly referred to as an analysis model), which is a simplification model simplified by the geometry simplification processor 306. The simulation includes analysis, evaluation, optimization, and so on and a known simulation method may be used. The simplification target feature extractor 304 is an example to which an extraction unit is applied. The simplification target feature confirmer 305 is an example to which a confirmation unit is applied. The geometry simplification processor 306 is an example to which a simplification unit is applied.

Figure 16:
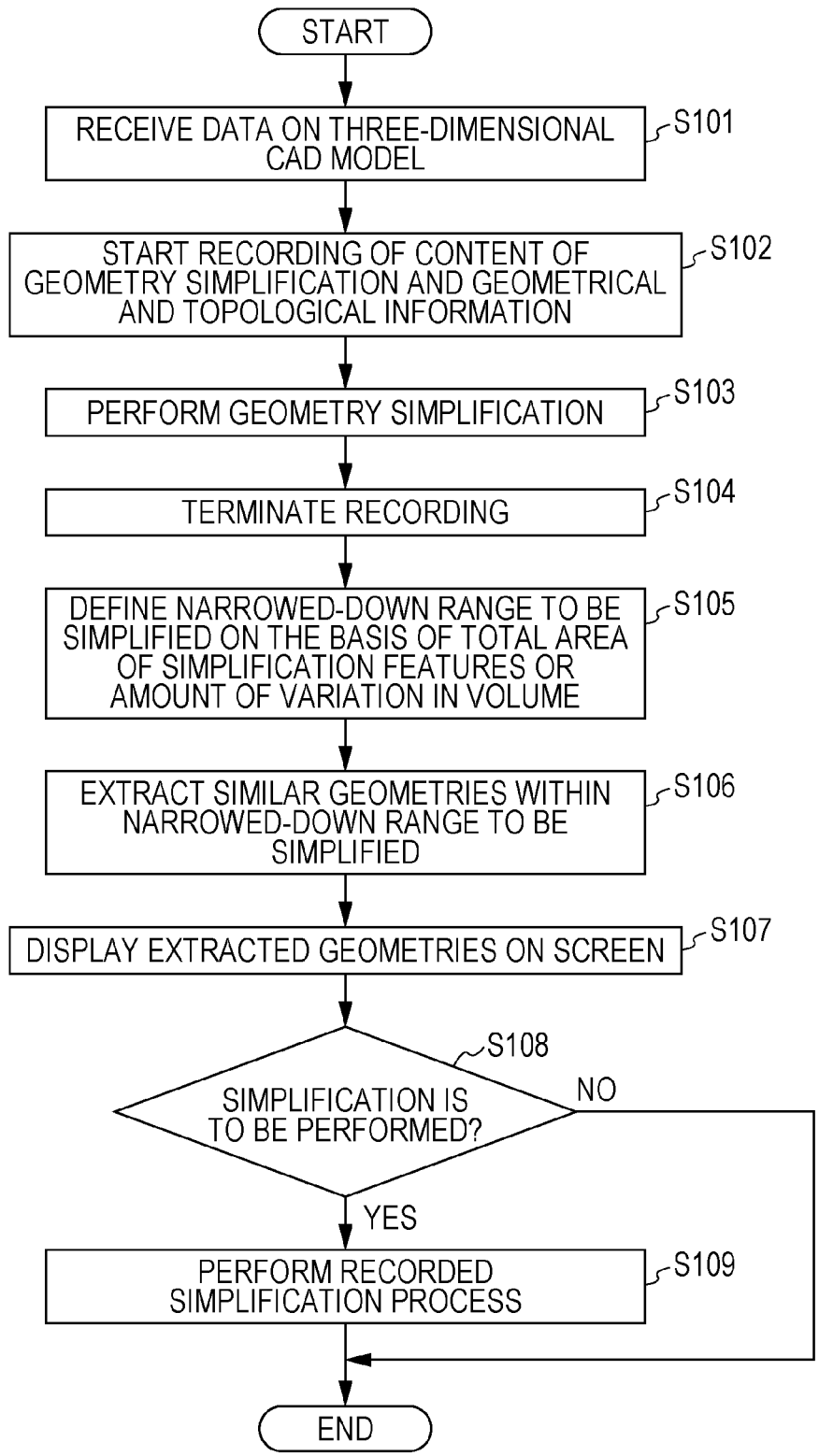
FIG. 16 is a flowchart showing an example of a geometry simplification process according to an embodiment of the present invention.

An example of a process in the computer system 100 according to the present embodiment will now be described with reference to FIG. 16. FIG. 16 is a flowchart showing an example of a geometry simplification process in the present embodiment. The geometry simplification process is performed by the CPU 201 that executes the program.

Referring to FIG. 16, in Step S101, the main body 101 of the computer system 100 receives a CAD model to be designed. The CAD model may be received from the input unit or the storage unit, such as the RAM or the ROM, in the computer system 100 or may be received from another computer system via a communication line. Alternatively, the CAD model may be received from a recording medium (for example, the disk 110) outside the computer system 100. Upon manual simplification of the received CAD model by the user with the input unit, such as the mouse 104, the simplification process recorder 301 records the content of the simplification process and the simplification feature recorder 302 records the geometrical information and the topological information about simplification features.

A specific example of the simplification process will now be described. FIGS. 4A to 4D illustrate CAD models before and after the simplification of feature geometries. In the CAD model before the simplification in FIG. 4A, a hole 402 penetrates through a part 401. An embedding process can be performed to the hole 402 to create a simplification model, such as a part 403. In the CAD model before the simplification in FIG. 4B, a boss 405 exits on a part 404. A deletion process can be performed to the boss 405 to create a simplification model, such as a part 406. In the CAD model before the simplification in FIG. 4C, fillets 408 and 409 exist on both sides of a flection of a part 407. A squaring process can be performed to the fillets 408 and 409 to create a simplification model, such as a part 410. In the CAD model before the simplification in FIG. 4D, chamfers 412 and 413 exist on both sides of a flection of a part 411. The squaring process can be performed to the chamfers 412 and 413 to create a simplification model, such as a part 414.

The above four examples indicate the typical feature geometries of CAD models. In the simplification of the above CAD models, the dimensions can be used as threshold values to collectively simplify the CAD models. In the case of geometries other than the above feature geometries, the simplification model can be created if, for example, a face or a group of faces to be simplified can be deleted to extend or connect faces adjacent to the face or faces. Accordingly, it is possible to create the simplification model also for geometries other than the feature geometries by performing the simplification on the basis of an instruction from the user.

Referring back to FIG. 16, in Step S102, the simplification process recorder 301 starts recording of the content of the simplification and the simplification feature recorder 302 starts recording of the geometrical information and the topological information about the simplification features. In Step S103, the computer system 100 creates a simplification model in response to a simplification operation by the user. Upon termination of the simplification operation by the user, in Step S104, the simplification process recorder 301 terminates the recording of the content of the simplification and the simplification feature recorder 302 terminates the recording of the geometrical information and the topological information about the features where the simplification process has been performed.

Figure 5A:
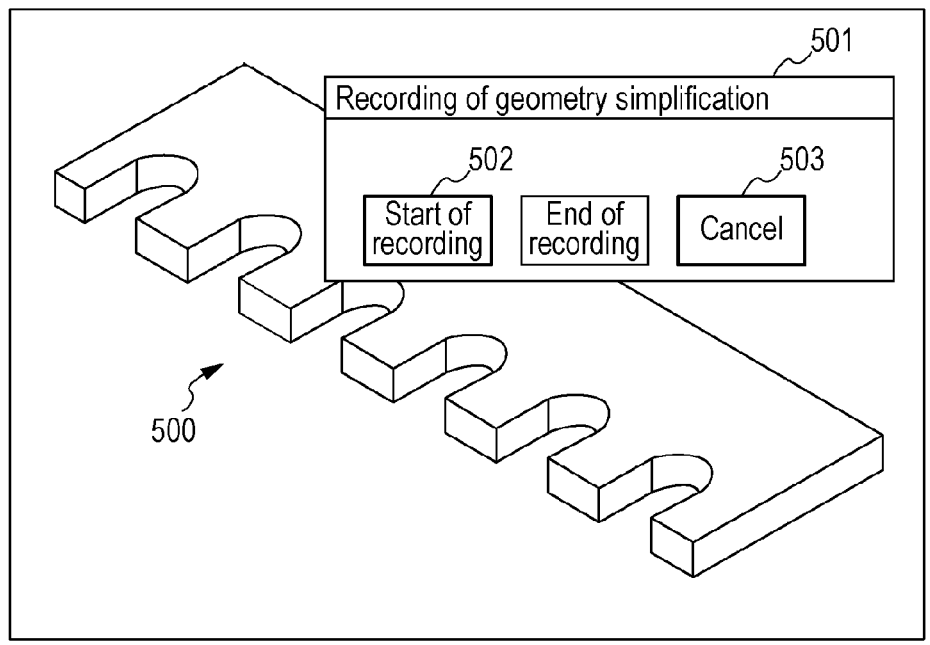
FIGS. 5A to 5D illustrate how to perform recording of a simplification process.
Figure 5B:
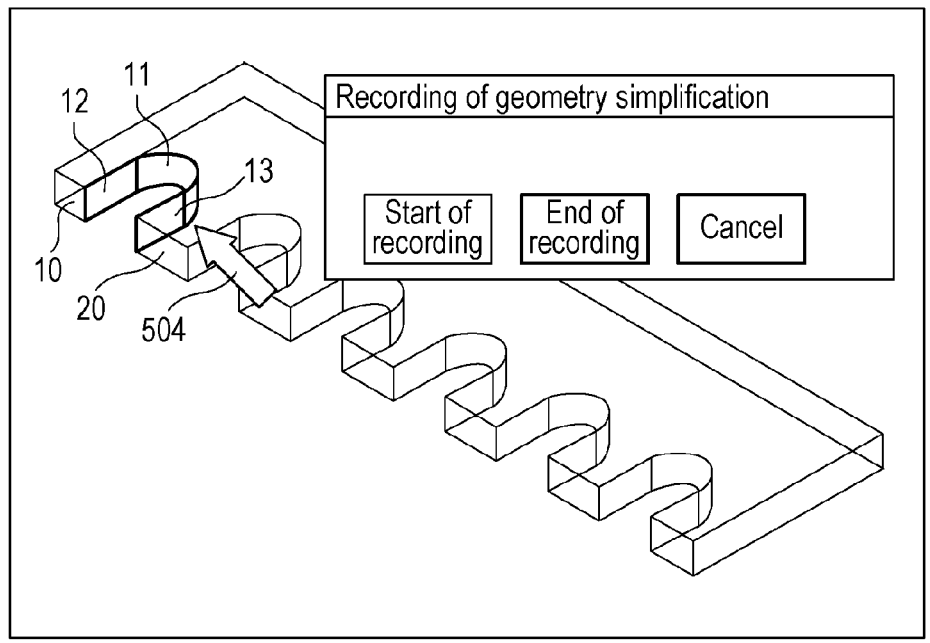
Figure 5C:
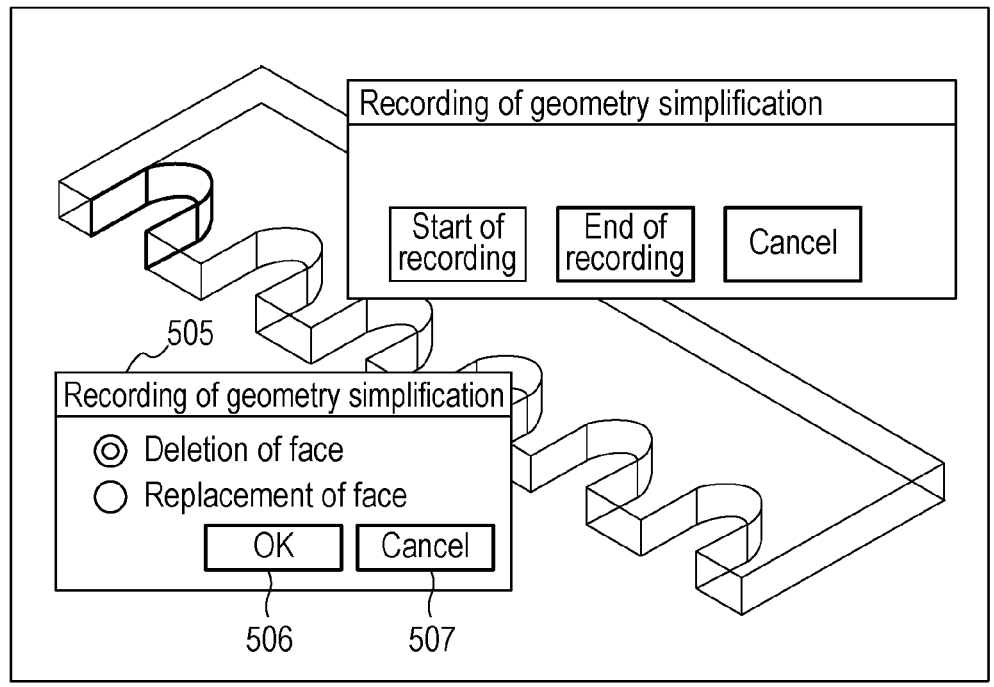
Figure 5D:
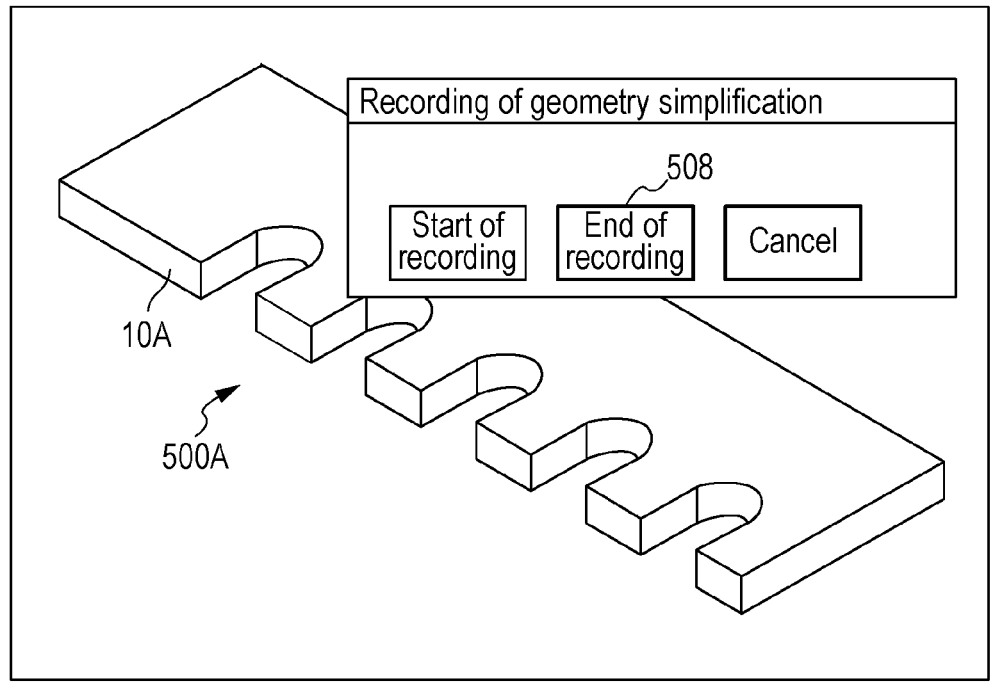

The above flow will now be specifically described with reference to FIGS. 5A to 5D. FIG. 5A shows a screen image at start of the recording of the simplification. As shown in FIG. 5A, a CAD model 500 to be simplified and an instruction user interface 501 used for instructing start and termination of the recording of the simplification are displayed in the display 102. Selecting a Start of recording button 502 in the instruction user interface 501 starts the recording of the simplification. If a Cancel button 503 is selected before the recording of the simplification is terminated, the recording of the simplification is cancelled. FIG. 5B shows a screen image that is displayed in selection of the simplification features. In the screen image in FIG. 5B, the user uses a mouse pointer 504 to select faces 11, 12, and 13 to be simplified. FIG. 5C shows a screen image that is displayed when the simplification is performed. In the screen image in FIG. 5C, an instruction user interface 505 used for instructing the simplification is displayed in a state in which the features to be simplified are selected. Selection of a simplification method and an OK button 506 on the instruction user interface 505 by the user causes the simplification process to be performed. When the user wants to stop the simplification process, for example, if the user wrongly selects the features to be simplified, a Cancel button 507 can be selected to return to the stage (FIG. 5B) in which the simplification features are selected. FIG. 5D shows a screen image at end of recording of the simplification. In the screen image in FIG. 5D, a simplification model 500A is created in which a U-shaped cutout is flattened and a face 10 extends toward a face 20 to connect the face 10 to the face 20 to form a face 10A. The user confirms whether the simplification model 500A is an appropriate simplification model and selects an End of recording button 508 if the simplification model 500A is appropriate. In the above flow, the simplification process recorder 301 records the process of selecting the simplification features and the simplification method, which have been performed in response to the instruction by the user before the End of recording button 508 is selected. The simplification feature recorder 302 records the geometrical information and the topological information about the simplified features. Although the instruction user interfaces for the recording of the simplification and the simplification process are displayed and the buttons in the user interfaces are selected to perform the recording of the simplification and the simplification process in the present embodiment, for example, icons having the same functions as those of the instruction user interfaces may be prepared.

The content of the recording in the simplification process recorder 301 and the simplification feature recorder 302 will now be specifically described. The simplification process recorder 301 records the selection order of simplification features and the simplification method. FIG. 6 shows an example of the content of the recording in the simplification process recorder 301 in terms of the simplification process described above with reference to FIGS. 5A to 5D. In the simplification process described above with reference to FIGS. 5A to 5D, "face 11→face 12→face 13" is recorded as the selection order of the simplification features and "deletion of face" is recorded as the simplification method. The simplification feature recorder 302 records the geometrical information and the topological information including features selected in the simplification process, the kinds of the features, the areas thereof, the adjacency relationship between the selected features, the number of edges, the angle formed by the normal vectors of adjacent faces at a point on the common edge between the adjacent faces (hereinafter referred to as an angle formed by the normal vectors), and the amount of variation in volume due to the simplification process. The kinds of faces include a plain face, a cylindrical face, and a sphere. When the type of a face is the cylindrical face, the central angle of an arc formed by a curved line edge existing in the cylindrical face is also recorded. An exemplary method of calculating the central angle will now be described.

First, two straight line edges are extracted from the edges composing the cylindrical face and the normal vector of the cylindrical face at a point on each straight line edge (for example, the midpoint of each straight line edge) is derived to calculate the central point where the normal vectors intersect with each other. Then, the distance between the central point and each straight line edge is measured, the length of the circumference of a circle having the measured distance as the radius is calculated, and the ratio between the length of the curved line edge and the length of the circumference is multiplied by 360 degrees to acquire the central angle. The above calculation method is an example and another method may be adopted. When the faces are not directly adjacent to each other (for example, the face 12 and the face 13), the information about a face or faces between the faces is also recorded as the adjacency relationship. The angle formed by the normal vectors of adjacent faces at a point on the common edge between the adjacent faces is recorded as the angle formed by the normal vectors. Since the angle formed by the normal vectors is recorded here, the angle is within a range from 0 degrees to 180 degrees. A positive value is recorded as the amount of variation in volume when the volume is increased as the result of, for example, the embedding process for the CAD model while a negative value is recorded as the amount of variation in volume when the volume is decreased as the result of, for example, the deletion process for the CAD model. FIG. 7 shows an example of the content of the recording in the simplification feature recorder 302 in terms of the simplification process described above with reference to FIGS. 5A to 5D.

Figure 8A:
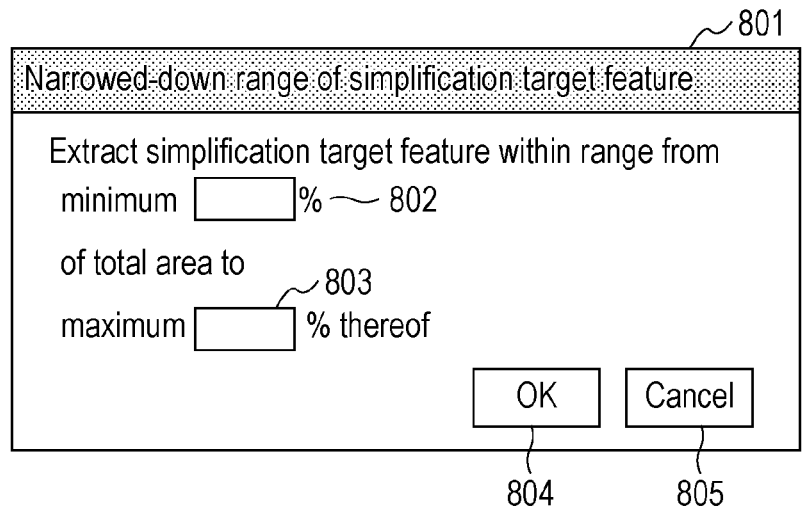
FIGS. 8A and 8B show exemplary setup user interfaces for defining a narrowed-down range.
Figure 8B:
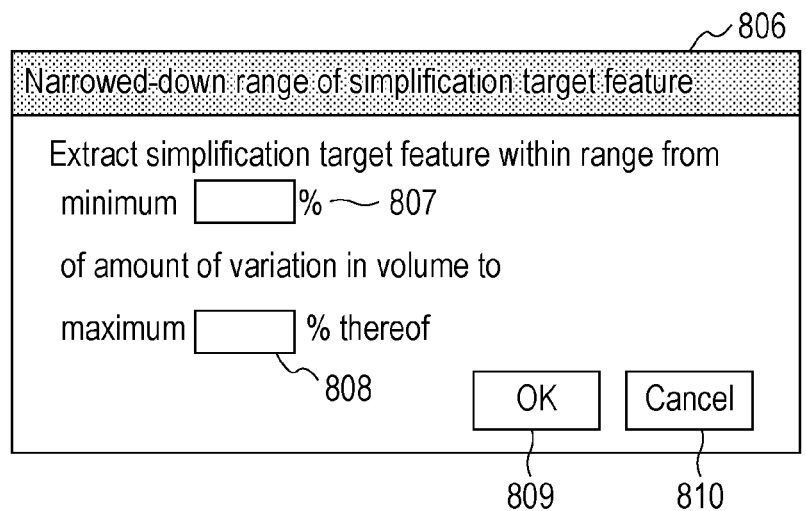

Similar geometries are extracted on the basis of the geometrical information and the topological information that are recorded in the above manner. However, similar geometries for which the user does not want to perform the simplification and which have excessively large difference in size may also be extracted. In order to resolve this problem, according to the present embodiment, in Step S105 in FIG. 16, a narrowed-down range resulting from narrowing down the extracted similar geometries to the features to be simplified is defined on the basis of the total area of the recorded simplification features or the amount of variation in volume due to the simplification. FIGS. 8A and 8B show exemplary setup user interfaces for defining the narrowed-down range. The setup user interfaces in FIGS. 8A and 8B are displayed by using the function of the narrowed-down range setter 303. In the setup user interfaces, the similar geometries for which the user does not want to perform the simplification and which have excessively large difference in size can be excluded from the simplification target by setting an upper limit and a lower limit in percentage of the total area of the faces for which the simplification has been manually performed or setting an upper limit and a lower limit in percentage of the amount of variation in volume due to the simplification. FIG. 8A shows a setup user interface 801 in which the narrowed-down range is defined with respect to the total area. FIG. 8B shows a setup user interface 806 in which the narrowed-down range is defined with respect to the amount of variation in volume. In the setup user interface 801 based on the total area, the user sets the range of the simplification target by inputting the lower limit in percentage of the total area of the faces in an input field 802 and inputting the upper limit thereof in an input field 803, where the total area of the faces for which the simplification is manually performed is set to 100%. The narrowed-down range setter 303 sets the content of the input by the user as the defined narrowed-down range if an OK button 804 is selected by the user after the narrowed-down range is set as the simplification target and cancels the content of the input by the user if a Cancel button 805 is selected by the user after the narrowed-down range is set as the simplification target. Upon selection of the OK button 804, the simplification target feature extractor 304 extracts the similar geometries on the basis of the geometrical information and the topological information recorded by the simplification feature recorder 302. In Step S106 in FIG. 16, the simplification target feature extractor 304 extracts the features corresponding to the narrowed-down range with respect to the total area, defined by the narrowed-down range setter 303, from the extracted similar geometries as the similar geometries targeted for the simplification.

It may be determined whether each face that has been manually simplified is included in the narrowed-down range with respect to the area of the face, instead of the total area. Also in the setup user interface 806 based on the amount of variation in volume, as in the setup user interface 801 based on the total area, the user sets the range of the simplification target by inputting the lower limit in percentage of the amount of variation in volume due to the manual simplification in an input field 807 and inputting the upper limit thereof in an input field 808, where the amount of variation in volume when the simplification is manually performed is set to 100%. The input by the user is determined if an OK button 809 is selected by the user after the narrowed-down range is set as the simplification target and the input by the user is cancelled if a Cancel button 810 is selected by the user after the narrowed-down range is set as the simplification target. Upon selection of the OK button 809, the simplification target feature extractor 304 extracts the similar geometries on the basis of the geometrical information and the topological information recorded by the simplification feature recorder 302. In addition, the simplification target feature extractor 304 calculates the amount of variation in volume before and after the simplification of the similar geometries. In Step S106 in FIG. 16, the simplification target feature extractor 304 extracts the features corresponding to the narrowed-down range with respect to the amount of variation in volume, defined by the narrowed-down range setter 303, as the similar geometries targeted for the simplification. Although the user arbitrarily inputs the narrowed-down range in the example in the present embodiment, the narrowed-down range may be set in a program in advance and Step S105 may be omitted.

Figure 9:
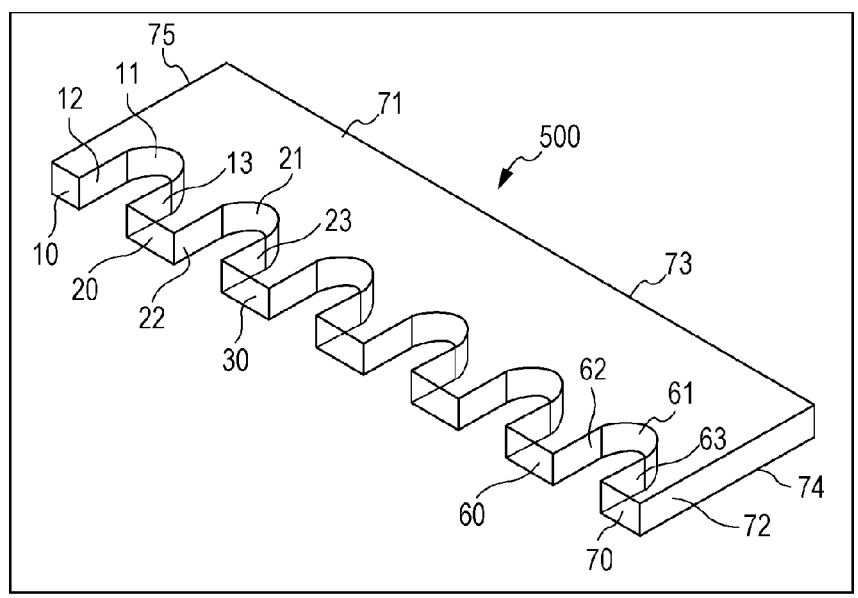
FIG. 9 shows a CAD model targeted for the simplification process.
Figure 10:
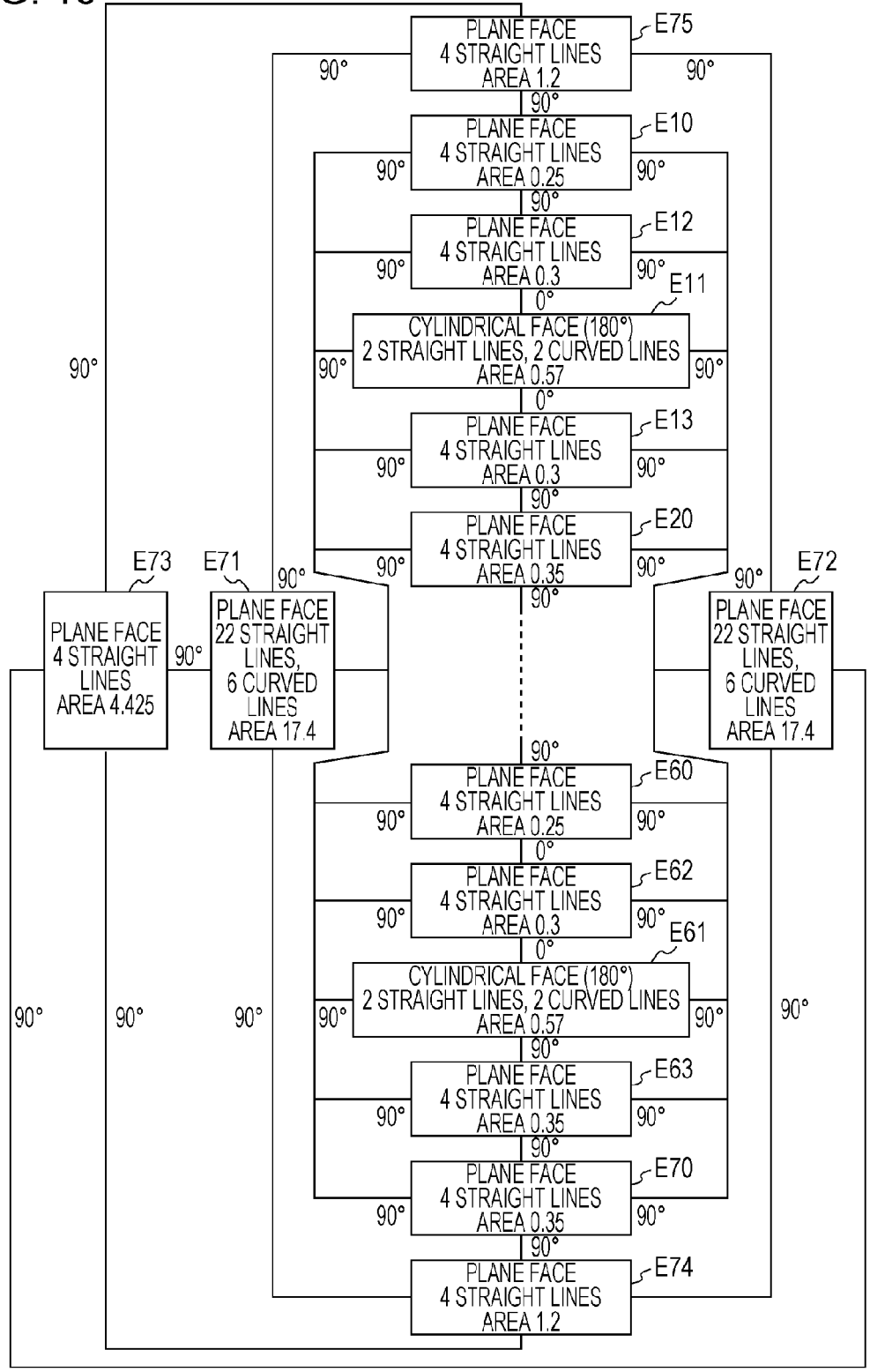
FIG. 10 is a connection graph indicating face information about all the faces composing the CAD model in FIG. 9 and the connection relationship between the faces.

A method of extracting the similar geometries from the geometrical information and the topological information that are recorded will now be described by using the CAD model and the simplification method in FIGS. 5A to 5D. FIG. 9 shows the CAD model 500 described above. FIG. 10 is a connection graph indicating face information about all the faces composing the CAD model 500 and the connection relationship between the faces. The connection graph in FIG. 10 is based on the geometrical information and the topological information of the CAD model 500. The faces 11, 12, and 13 in FIG. 9 correspond to elements E11, E12, and E13 in the connection graph in FIG. 10 and the remaining faces in FIG. 9 similarly correspond to elements in FIG. 10. Each element has the face information indicating the kind of the corresponding face, the area of the corresponding face, and the number of edges composing the corresponding edge. Each line segment connecting the elements has information about the angle formed by the normal vectors.

Figure 11A:
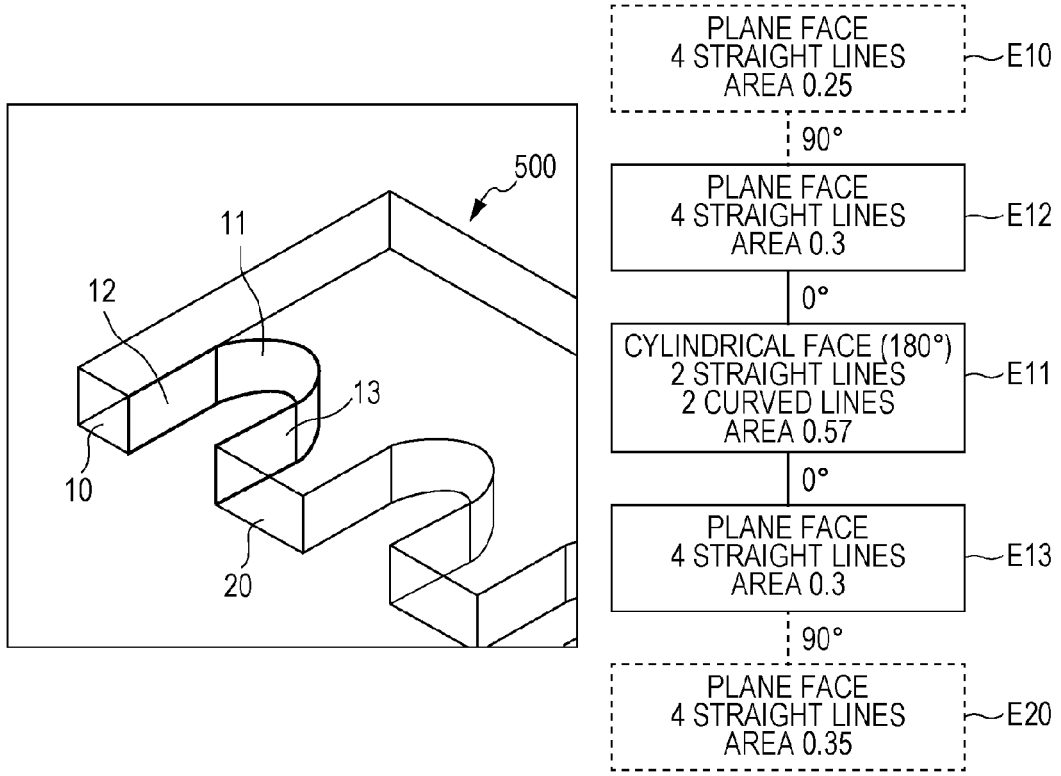
FIG. 11A shows part of a CAD model before the simplification and its partial connection graph and FIG. 11B shows part of a simplification model after the simplification and its partial connection graph.
Figure 11B:
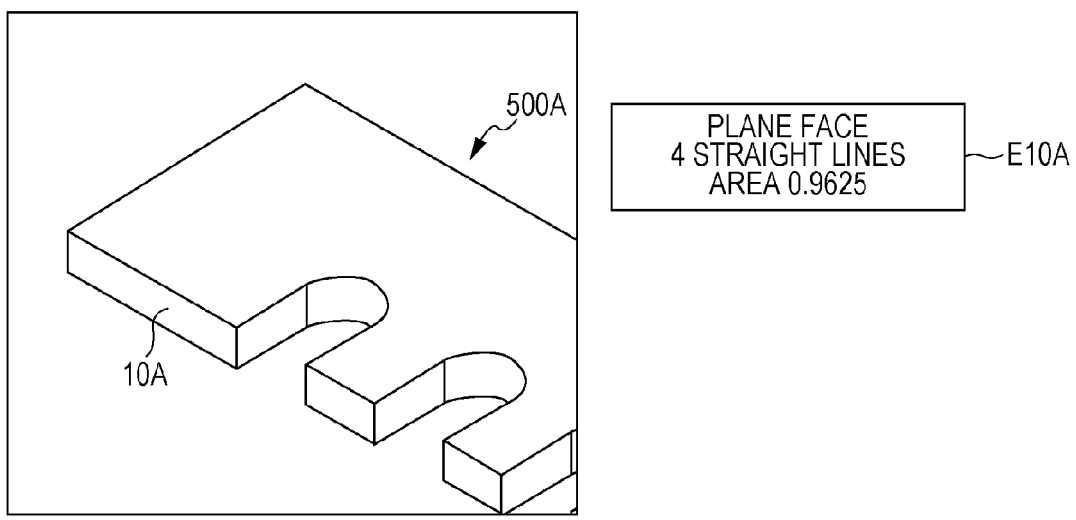
Figure 12:
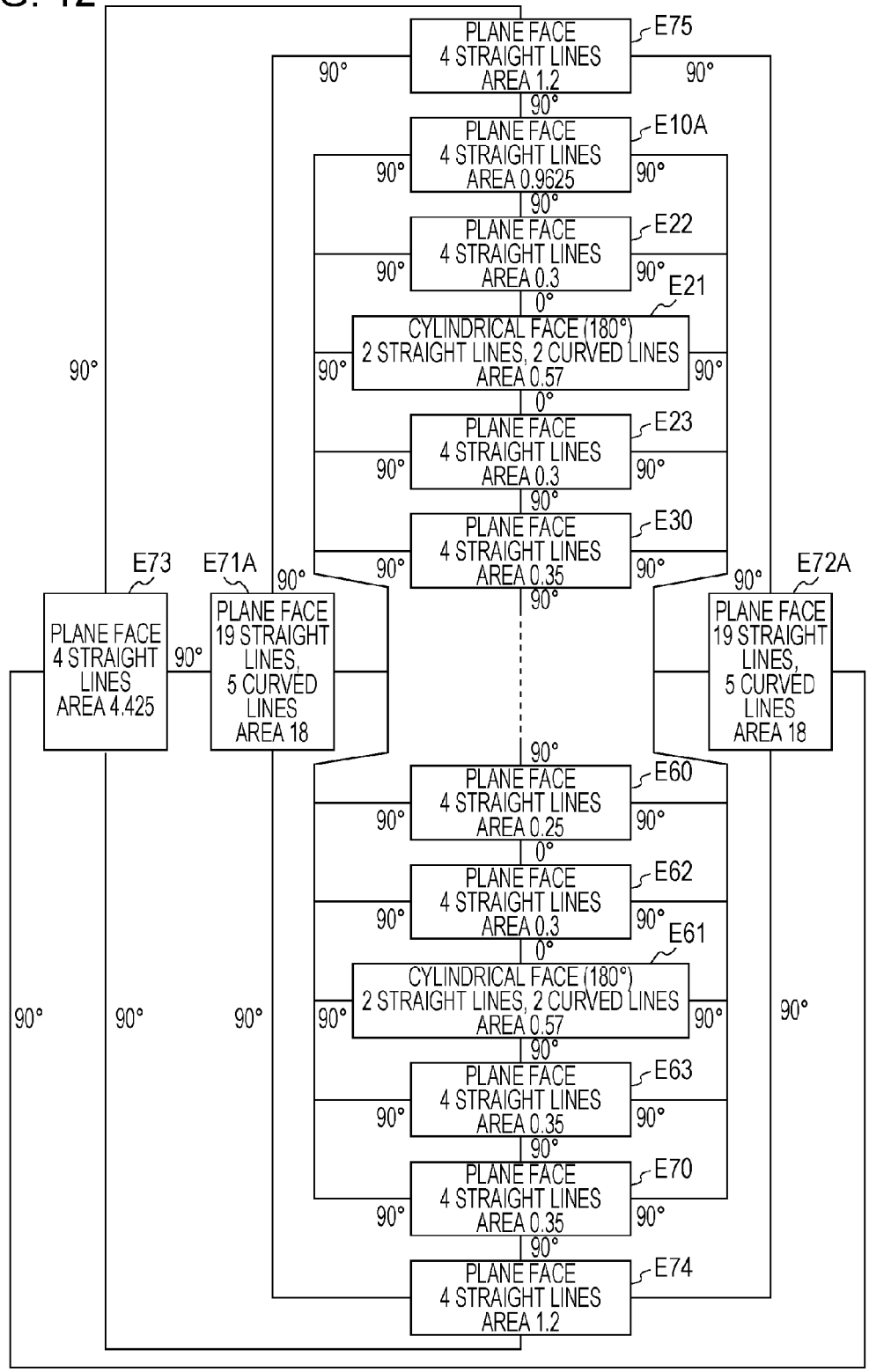
FIG. 12 is a connection graph of the simplification model after the simplification.

In the simplification described above with reference to FIGS. 5A to 5D, the faces are selected in the order "face 11→face 12→face 13" and the "deletion of face" is performed to create the simplification model 500A having the face 10A resulting from extension and connection of the face 10 and the face 20. FIG. 11A shows part of the CAD model 500 before the simplification and its partial connection graph. FIG. 11B shows part of the simplification model 500A after the simplification and its partial connection graph. The simplification described above with reference to FIGS. 5A to 5D causes elements E10, E12, E11, E13, and E20 in the partial connection graph in FIG. 11A to be replaced with an element E10A in FIG. 11B. FIG. 12 is a connection graph of the simplification model 500A after the simplification.

In the extraction of the similar geometries, elements having the same face information, excluding the areas, as that of one element (for example, the element E11) composing the partial connection graph of the faces that have been selected as the simplification features before the simplification are detected. If elements (for example, an element E61) having similar face information are detected, it is determined whether the elements form the partial connection graph in which the elements having the same face information, excluding the areas, are connected by the line segments having the same information about the angle formed by the normal vectors, like the partial connection graph of the faces that have been selected as the simplification features before the simplification. If the determination shows that the elements form the similar partial connection graph (for example, elements E62, E61, and E63), these elements are extracted as the similar geometries. Performing the above processing to the all the elements in the connection graph allows the similar geometries to be extracted.

The simplification target feature extractor 304 extracts the similar geometries from the geometrical information and the topological information that are recorded in the above manner to narrow down the range on the basis of the total area or the amount of variation in volume. In Step S107 in FIG. 16, the simplification target feature confirmer 305 displays the similar geometries targeted for the simplification on the screen. The user can confirm the similar geometries targeted for the simplification on the screen.

Figure 13:
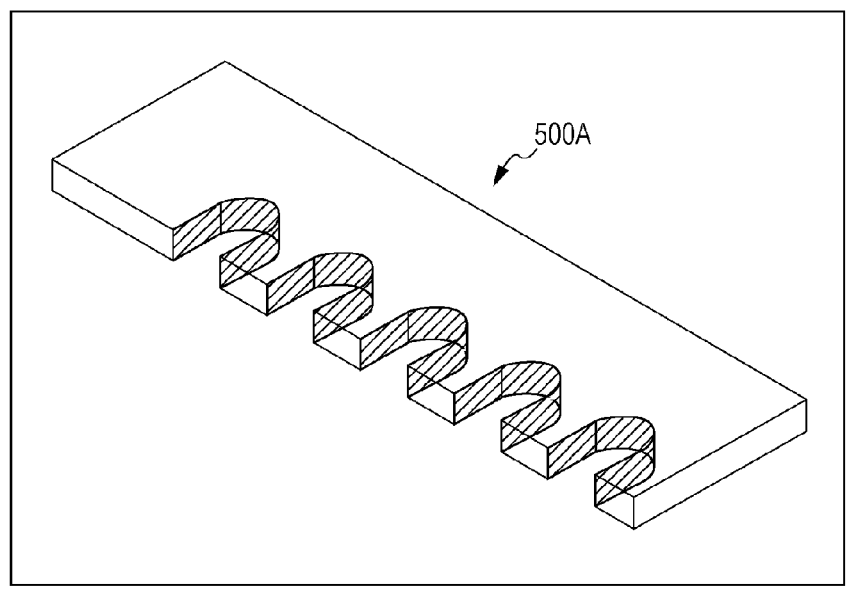
FIG. 13 shows an example of the result of extraction of similar geometries targeted for the simplification by a simplification target feature extractor.

FIG. 13 shows an example of the result of the extraction of the similar geometries targeted for the simplification by the simplification target feature extractor 304. The similar geometries shown in FIG. 13 result from extraction of the geometries similar to those of the simplification features in the simplification for the simplification model 500, selection of the corresponding faces in the selection order recorded by the simplification process recorder 301, and highlight of shaded portions. The narrowed-down range, which corresponds to the simplification target, is set to a range from 95% of the total area to 105% thereof in consideration of, for example, errors in the CAD model to extract the similar geometries targeted for the simplification. The extraction target is not limited to one part and the extraction may be performed to other multiple parts on the basis of the simplification for one part.

Referring to FIG. 16, in Step S108, the geometry simplification processor 306 determines whether the simplification method recorded by the simplification process recorder 301 is to be performed to the similar geometries targeted for the simplification, confirmed in Step S107. This determination is based on an instruction from the user concerning the simplification in response to a query on the screen to the user about whether the simplification method is to be performed. If the geometry simplification processor 306 determines that the simplification is to be performed, then in Step S109, the geometry simplification processor 306 performs the simplification method recorded by the simplification process recorder 301. Then, the geometry simplification process is terminated. If the geometry simplification processor 306 determines that the simplification is not to be performed, the geometry simplification processor 306 does not perform the simplification to the features and, then, the geometry simplification process is terminated. The geometry simplification process is an example of processing in a selection unit.

Figure 14A:
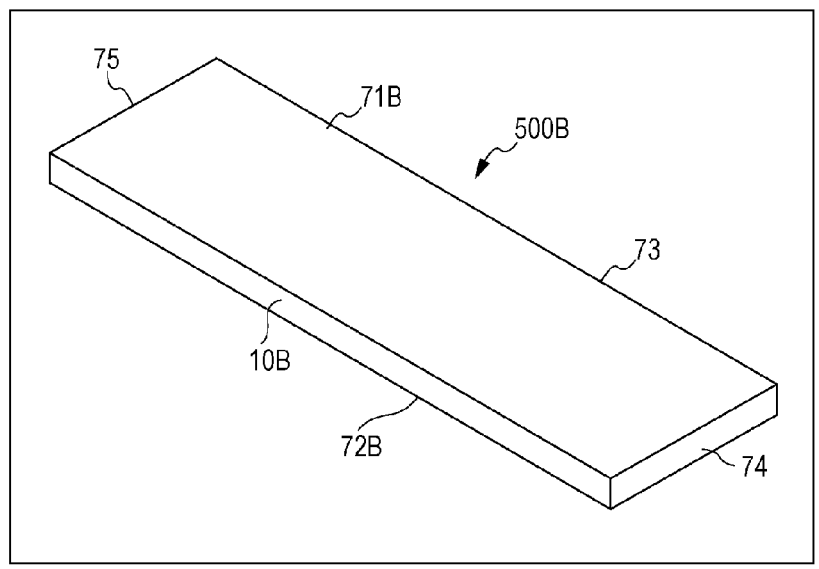
FIG. 14A shows a simplification model resulting from the simplification for all the similar geometries extracted in the manner shown in FIG. 13

FIG. 14A shows a simplification model 500B resulting from the simplification method recorded by the simplification process recorder 301. The simplification method is performed to all the similar geometries extracted in the manner shown in FIG. 13. FIG. 14B is a connection graph of the simplification model 500B. A face 10B is created in the simplification model 500B, which results in a rectangular parallelepiped. The simplification model 500B has the simple connection graph shown in FIG. 14B. Although the similar geometries targeted for the simplification are collectively simplified here, the user may determine whether the simplification is to be performed for each similar geometry targeted for the simplification to determine the simplification process. In addition, the confirmation step by the user in Step S108 may be omitted and all the extracted similar geometries targeted for the simplification may be automatically simplified.

Furthermore, the record of the simplification processes that have been performed may be read out for reuse. FIG. 15 is an exemplary list of the simplification processes that are recorded for reuse. The list of the simplification processes that have been recorded is created and a simplification process is read out from the list according to need to allow the user to appropriately perform the readout simplification process. The simulation is performed to data about the simplification model (analysis model) created in the above manner. The simulation includes analysis, evaluation, optimization, and so on. Only the analysis may be performed, the analysis and the evaluation may be performed, or the analysis, the evaluation, and the optimization may be performed.

The similar features are extracted from the features in a part for which the geometry simplification has been manually performed and the similar features are simplified on the basis of information about, for example, the content of the geometry simplification that has been manually performed in the above embodiments. Accordingly, it is possible to efficiently create an analysis model.

Aspects of the present invention can also be realized by a computer of a system or apparatus (or devices such as a CPU or a micro-processing unit (MPU)) that reads out and executes a program recorded on a memory device to perform the functions of the above-described embodiments, and by a method, the steps of which are performed by a computer of a system or apparatus by, for example, reading out and executing a program recorded on a memory device to perform the functions of the above-described embodiments.

For this purpose, the program is provided to the computer for example via a network or from a recording medium of various types serving as the memory device (e.g. computer-readable medium).

While the present invention has been described with reference to exemplary embodiments, it is to be understood that the invention is not limited to the disclosed exemplary embodiments. The scope of the following claims is to be accorded the broadest interpretation so as to encompass all such modifications and equivalent structures and functions.

This application claims the benefit of Japanese Patent Application No. 2009-272426, filed Nov. 30, 2009, which is hereby incorporated by reference herein in its entirety.

What is claimed is:

1. A geometry simplification apparatus comprising:
an extraction unit configured to extract at least one additional feature in a geometry from a part, the at least one additional feature similar to a first feature in the geometry from the part for which geometry simplification has already been manually performed to simplify the first feature, wherein the extraction unit is configured to extract the at least one additional feature based on information about a selection order and a simplification method of the simplified first feature and to extract a feature targeted for simplification from the at least one additional feature; and a simplification unit configured to simplify the feature targeted for simplification extracted by the extraction unit based on information about a geometry simplification method performed to the first feature.

2. The geometry simplification apparatus according to claim 1, further comprising:
an input unit configured to receive information about a range to which the feature targeted for the simplification is narrowed down relative to the first feature,
wherein the extraction unit extracts the feature targeted for the simplification from the at least one additional feature based on the range information.

3. The geometry simplification apparatus according to claim 2,
wherein the range information is based on the area of a surface in the first feature for which the geometry simplification has been manually performed or an amount of variation in volume in the first feature.

4. The geometry simplification apparatus according to claim 3, further comprising:
a confirmation unit configured to allow a user to confirm the feature targeted for simplification extracted by the extraction unit.

5. The geometry simplification apparatus according to claim 4, further comprising:
a selection unit configured to allow the user to determine whether the simplification is to be performed to the feature targeted for simplification extracted by the extraction unit and confirmed by the user with the confirmation unit.

6. The geometry simplification apparatus according to claim 5,
wherein the information about the first feature includes at least one of geometrical information and topological information about the first feature.

7. The geometry simplification apparatus according to claim 5,
wherein the information about the geometry simplification method includes at least one of a kind of the first feature, an area thereof, an adjacency relationship thereof, a number of edges thereof, an angle formed by normal vectors of adjacent faces at a point on a common edge between adjacent faces, and an amount of variation in volume due to the simplification.

8. The geometry simplification apparatus according to claim 3,
wherein the information about the first feature includes at least one of geometrical information and topological information about the first feature.

9. The geometry simplification apparatus according to claim 3,
wherein the information about the geometry simplification method includes at least one of a kind of the first feature, an area thereof, an adjacency relationship thereof, a number of edges thereof, an angle formed by normal vectors of adjacent faces at a point on a common edge between adjacent faces, and an amount of variation in volume due to the simplification.

10. The geometry simplification apparatus according to claim 2, further comprising:
a confirmation unit configured to allow a user to confirm the feature targeted for simplification extracted by the extraction unit.

11. The geometry simplification apparatus according to claim 2,
wherein the information about the first feature includes at least one of geometrical information and topological information about the first feature.

12. The geometry simplification apparatus according to claim 2,
wherein the information about the geometry simplification method includes at least one of a kind of the first feature, an area thereof, an adjacency relationship thereof, a number of edges thereof, an angle formed by normal vectors of adjacent faces at a point on a common edge between adjacent faces, and an amount of variation in volume due to the simplification.

13. The geometry simplification apparatus according to claim 1, further comprising:
a confirmation unit configured to allow a user to confirm the feature targeted for simplification extracted by the extraction unit.

14. The geometry simplification apparatus according to claim 13,
wherein the information about the first feature includes at least one of geometrical information and topological information about the first feature.

15. The geometry simplification apparatus according to claim 13,
wherein the information about the geometry simplification method includes at least one of a kind of the first feature, an area thereof, an adjacency relationship thereof, a number of edges thereof, an angle formed by normal vectors of adjacent faces at a point on a common edge between adjacent faces, and an amount of variation in volume due to the simplification.

16. The geometry simplification apparatus according to claim 1,
wherein the information about the first feature includes at least one of geometrical information and topological information about the first feature.

17. The geometry simplification apparatus according to claim 1,
wherein the information about the geometry simplification method includes at least one of a kind of the first feature, an area thereof, an adjacency relationship thereof, a number of edges thereof, an angle formed by normal vectors of adjacent faces at a point on a common edge between adjacent faces, and an amount of variation in volume due to the simplification.

18. A geometry simplification method comprising the steps of:
extracting at least one additional feature in a geometry from a part, the at least one additional feature similar to a first feature in the geometry from the part for which geometry simplification has already been manually performed to simplify the first feature, wherein the extracting of the at least one additional feature is based on information about a selection order and a simplification method of the simplified first feature and wherein the extracting further extracts a feature targeted for simplification from the at least one additional feature; and
simplifying the feature targeted for simplification extracted in the extraction step based on information about a geometry simplification method performed to the first feature.

19. A non-transitory computer-readable storage medium that stores a program of instructions executable by a computer for causing the computer to execute the steps of:
extracting at least one additional feature in a geometry from a part, the at least one additional feature similar to a first feature in the geometry from the part for which geometry simplification has already been manually performed to simplify the first feature, wherein the extracting is based on information about a selection order and a simplification method of the simplified first feature and wherein the extracting further extracts a feature targeted for simplification from the at least one additional feature; and simplifying the feature targeted for simplification extracted in the extraction step based on information about a geometry simplification method performed to the first feature.

\* \* \* \* \*